(12) United States Patent
Hakamada et al.

(10) Patent No.: US 12,484,192 B2
(45) Date of Patent: Nov. 25, 2025

(54) EVAPORATOR AND LOOP HEAT PIPE

(71) Applicant: KAWASAKI JUKOGYO KABUSHIKI KAISHA, Kobe (JP)

(72) Inventors: Kazuhide Hakamada, Kobe (JP); Keiji Sakagawa, Kobe (JP); Yu Haruki, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 197 days.

(21) Appl. No.: 18/013,026

(22) PCT Filed: Jun. 24, 2021

(86) PCT No.: PCT/JP2021/023933
§ 371 (c)(1),
(2) Date: Dec. 27, 2022

(87) PCT Pub. No.: WO2021/261552
PCT Pub. Date: Dec. 30, 2021

(65) Prior Publication Data
US 2023/0247793 A1    Aug. 3, 2023

(30) Foreign Application Priority Data
Jun. 24, 2020    (JP) .............................. 2020-108949

(51) Int. Cl.
    *H05K 7/20*        (2006.01)
(52) U.S. Cl.
    CPC ..... *H05K 7/20309* (2013.01); *H05K 7/20318* (2013.01); *H05K 7/20336* (2013.01)

(58) Field of Classification Search
CPC .......... H05K 7/20309; H05K 7/20318; H05K 7/20336
USPC ................................................... 165/104.26
See application file for complete search history.

(56) References Cited

U.S. PATENT DOCUMENTS

| 8,705,236 B2 | 4/2014 | Uchida et al. |
| 2007/0227703 A1 | 10/2007 | Bhatti et al. |
| 2010/0214740 A1* | 8/2010 | Silverstein ............ F25B 23/006 361/679.52 |

(Continued)

FOREIGN PATENT DOCUMENTS

| DE | 10 2012 111 489 A1 | 5/2014 |
| JP | H04-113660 A | 4/1992 |

(Continued)

*Primary Examiner* — Joel M Attey
(74) *Attorney, Agent, or Firm* — Oliff PLC (57) ABSTRACT

An evaporator that receives heat from a heat generator to change at least part of a working fluid from a liquid phase to a gas phase includes: a housing including an accommodation chamber that accommodates the working fluid; and a heat receiver located on a bottom surface of the housing and thermally connected to the heat generator. The housing includes: a porous plate dividing the accommodation chamber into an upper chamber and a lower chamber and including a large number of pores through which the upper and lower chambers communicate with each other; at least one working fluid inlet opening into the upper chamber; a partition dividing a bottom of the lower chamber into liquid retainers; and at least one working fluid outlet opening into the lower chamber and located above the partition.

9 Claims, 4 Drawing Sheets

(56) References Cited

U.S. PATENT DOCUMENTS

| | | |
|---|---|---|
| 2012/0026745 A1 | 2/2012 | Cheng et al. |
| 2013/0312939 A1* | 11/2013 | Uchida ................ H01L 23/427 165/104.26 |
| 2018/0164040 A1* | 6/2018 | Kusano ................ F28D 15/043 |

FOREIGN PATENT DOCUMENTS

| | | |
|---|---|---|
| JP | H05-315489 A | 11/1993 |
| JP | H07-115155 A | 5/1995 |
| JP | 2012-032146 A | 2/2012 |
| JP | 5741354 B2 | 7/2015 |

* cited by examiner

EVAPORATOR AND LOOP HEAT PIPE

CROSS-REFERENCE TO RELATED APPLICATIONS

This is a U.S. National Phase Application of PCT/JP2021/023933 filed on Jun. 24, 2021, which designates the United States and claims priority to Japanese Patent Application No. 2020-108949, filed Jun. 24, 2020, the entire contents of which are incorporated herein by reference.

TECHNICAL FIELD

The present disclosure relates to an evaporator and a loop heat pipe including the evaporator.

BACKGROUND ART

A loop heat pipe technology has been traditionally known which uses phase changes of a working fluid to achieve high-density heat transport. A heat transport system employing such a loop heat pipe has been used, for example, to cool an electronic device such as a computer or home electric appliance. In some loop heat pipes, the working fluid is circulated by means of capillary force and/or gravity.

A loop heat pipe includes a closed loop formed by an evaporator, a condenser, a vapor conduit leading from the evaporator to the condenser, and a liquid conduit leading from the condenser to the evaporator. The closed loop is charged with a working fluid. In the evaporator, the working fluid in a liquid phase is heated by heat transferred from a heat generator, and a part of the working fluid changes into a gas phase. The gas-liquid two-phase working fluid moves in the vapor conduit under the action of pressure difference and buoyancy and reaches the condenser. In the condenser, the working fluid is cooled into the liquid phase. The liquid-phase working fluid returns to the evaporator under the action of capillary force and/or gravity. In this manner, the loop heat pipe allows the working fluid to circulate in the two-phase closed loop and transport heat from the evaporator to the condenser, thereby cooling the heat generator thermally connected to the evaporator.

Patent Literature 1 proposes an evaporator used in a loop heat pipe as described above, and the evaporator includes a wick located in a lower portion of the evaporator. The pores of the wick are filled with a working fluid, and the liquid-phase working fluid remains in the evaporator while the loop heat pipe is not in operation.

CITATION LIST

Patent Literature

PTL 1: Japanese Patent No. 5741354

SUMMARY OF INVENTION

Technical Problem

Electronic devices have become more and more sophisticated and miniaturized, and this has recently led to a growing demand for thermal management in transportation machines such as watercrafts, railcars, automobiles, and aircrafts which are equipped with a large number of electronic devices. Some transportation machines incorporate a loop heat pipe as described above which uses gravity for circulation of a working fluid, and such a transportation machine, the position of the body of which constantly changes, suffers a position change-induced decrease in the drive force for allowing the working fluid to circulate and a corresponding decrease in the heat transport rate.

A type of evaporator includes a heat receiver located at the bottom of a container accommodating a working fluid, and the heat receiver is thermally connected to a heat generator. In case that such an evaporator is tilted, a situation can arise where the liquid-phase working fluid retained at the bottom of the container is not in contact with a part of the heat receiver. This leads to the heat receiver having a dry portion not in contact with the liquid-phase working fluid and a wet portion in contact with the liquid-phase working fluid. As the working fluid does not evaporate in the dry portion, the dry portion absorbs a smaller amount of heat than the wet portion. Thus, the dry portion exhibits a lower ability to cool the heat generator than the wet portion, and consequently the heat generator could be unevenly cooled.

The present disclosure has been made in view of the above circumstances, and an object of the present disclosure is to provide an evaporator and a loop heat pipe including the evaporator, the evaporator including a heat receiver located at the bottom of the evaporator and thermally connected to a heat generator, the evaporator and loop heat pipe being capable of effectively cooling the heat generator in contact with the heat receiver even in case that the position of the evaporator is changed.

Solution to Problem

An evaporator according to one aspect of the present disclosure is an evaporator that receives heat from a heat generator to change at least part of a working fluid from a liquid phase to a gas phase, the evaporator including: a housing including an accommodation chamber that accommodates the working fluid; and a heat receiver located on a bottom surface of the housing and thermally connected to the heat generator. The housing includes: a porous plate dividing the accommodation chamber into an upper chamber and a lower chamber and including a large number of pores through which the upper and lower chambers communicate with each other; at least one working fluid inlet opening into the upper chamber; a partition dividing a bottom of the lower chamber into liquid retainers; and at least one working fluid outlet opening into the lower chamber and located above the partition.

A loop heat pipe according to one aspect of the present disclosure includes: the above evaporator that changes at least part of a working fluid from a liquid phase to a gas phase; a condenser that changes the working fluid from the gas phase to the liquid phase; a vapor conduit connecting the working fluid outlet of the evaporator and an inlet of the condenser; and a liquid conduit connecting an outlet of the condenser and the working fluid inlet of the evaporator.

In the evaporator and loop heat pipe configured as described above, the liquid-phase working fluid flowing into the upper chamber of the accommodation chamber of the evaporator enters the lower chamber through the pores of the porous plate and falls into the liquid retainers of the lower chamber. Due to flow resistance accompanying passage through the pores, the working fluid in the upper chamber spreads on the porous plate rather than immediately flowing down into the lower chamber. Thus, the working fluid in the upper chamber is delivered not only to pores directly below the working fluid inlet but also to pores horizontally away from the working fluid inlet, and then falls into the lower chamber. As such, the working fluid is delivered not only to the liquid retainers directly below the working fluid inlet but also to the liquid retainers horizontally away from the working fluid inlet.

In case that the bottom surface of the housing of the evaporator is tilted from the horizontal, the liquid-phase working fluid in the liquid retainers is blocked by the partition from flowing downward along the tilted bottom surface and remains in the liquid retainers. Thus, in case that the position of the evaporator is changed and the bottom surface of the housing is tilted from the horizontal, the working fluid remains at the bottom of the accommodation chamber, and the heat receiver and the working fluid can be kept in thermal contact. Even in case that the heat receiver has dry portions that are not in thermal contact with the working fluid, the dry portions are distributed over different zones of the heat generator with which the heat receiver is in thermal contact, rather than being localized over a particular zone of the heat generator. Thus, despite the change in the position of the evaporator, the entire region of the heat generator that is in contact with the heat receiver can be cooled efficiently.

Advantageous Effects of Invention

The present disclosure can provide an evaporator and a loop heat pipe including the evaporator, the evaporator including a heat receiver located at the bottom of the evaporator and thermally connected to a heat generator, the evaporator and loop heat pipe being capable of effectively cooling the heat generator in contact with the heat receiver even in case that the position of the evaporator is changed.

DESCRIPTION OF EMBODIMENTS

Figure 1:
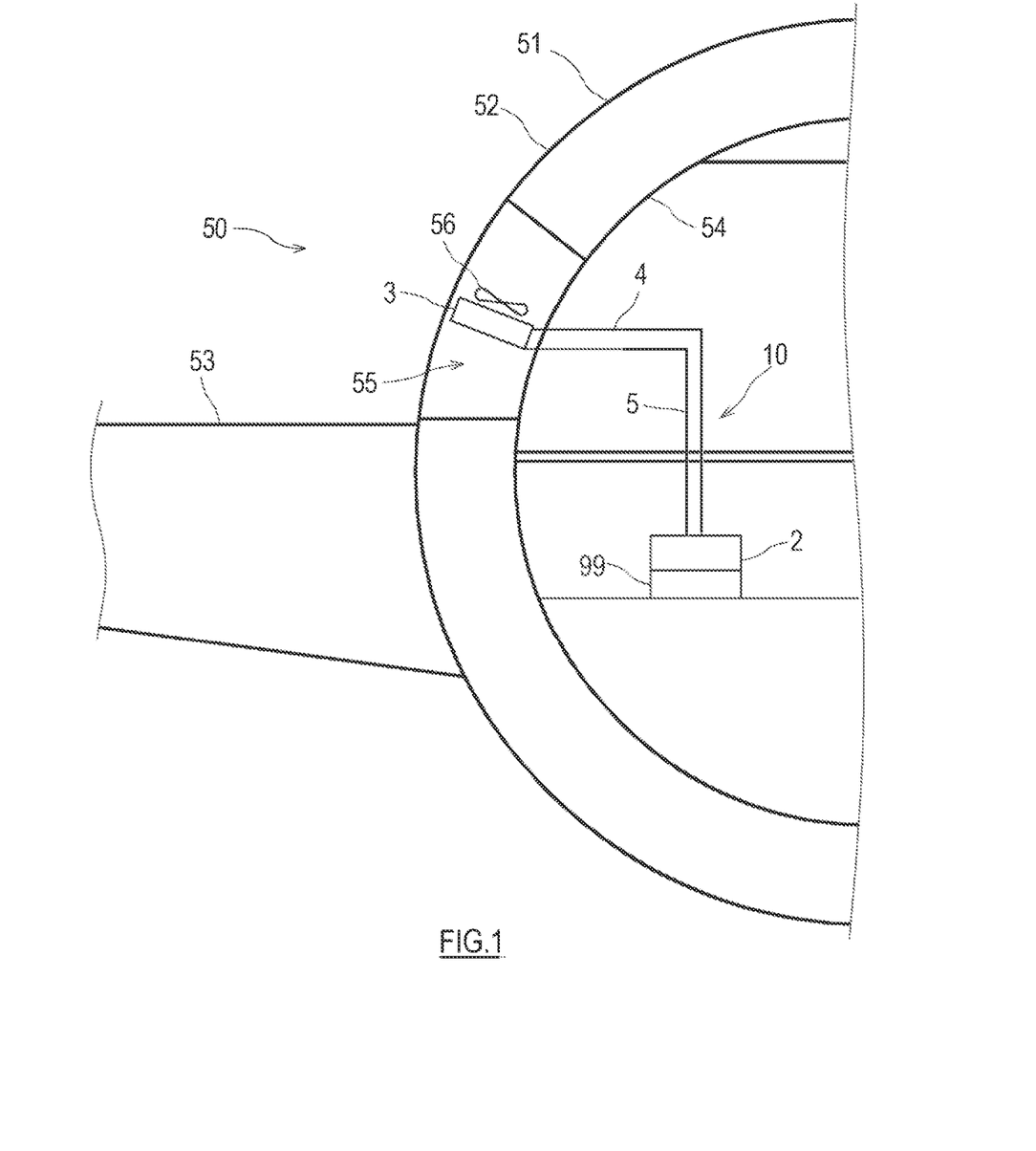
FIG. 1 shows a schematic configuration of an aircraft including a loop heat pipe according to an exemplary embodiment of the present disclosure.

Hereinafter, exemplary embodiments of the present disclosure will be described with reference to the drawings. FIG. 1 shows a schematic configuration of an aircraft 50 including a loop heat pipe 10 according to an exemplary embodiment of the present disclosure.

The loop heat pipe 10 of FIG. 1 includes an evaporator 2, a vapor conduit 4, a condenser 3, and a liquid conduit 5, which are connected to form a closed loop. The closed loop is charged with a working fluid which is a condensable fluid. The working fluid naturally circulates in the loop heat pipe 10 by means of phase changes and gravity. The working fluid is not limited to a particular type, and may be a condensable fluid commonly used as a working fluid in heat pipes. Examples of the condensable fluid include water, an alcohol, ammonia, a fluorocarbon, a hydrofluorocarbon, a hydrofluoroether, and a mixture of these fluids.

The evaporator 2 is thermally connected to a heat generator 99 which is a heat source. In the evaporator 2, the liquid-phase working fluid absorbs heat from the heat generator 99, and part of the working fluid boils into a gas phase. The gas-liquid two-phase working fluid moves in the vapor conduit 4 connecting the outlet of the evaporator 2 and the inlet of the condenser 3 under the action of pressure difference and buoyancy, thereby reaching the condenser 3.

The condenser 3 is located above the evaporator 2. The condenser 3 includes a cooling path (not shown), and the two-phase working fluid releases heat and is cooled into the liquid phase while passing through the cooling path. The liquid-phase working fluid descends in the liquid conduit 5 connecting the outlet of the condenser 3 and the inlet of the evaporator 2 under the action of gravity, thereby returning to the evaporator The loop heat pipe 10 configured as described above is mounted on a transportation machine. Examples of the transportation machine include watercrafts (including submersibles), railcars, automobiles, and aircrafts. In this exemplary embodiment, the loop heat pipe 10 is mounted on the aircraft 50 which is an example of the transportation machine. For the aircraft 50, the allowable tilt angle during normal operation is α°. During normal operation, the aircraft 50 is tiltable from the horizontal to the allowable tilt angle.

FIG. 1 partially shows a fuselage 51 and main wing 53 of the aircraft 50. The fuselage 51 has a multilayer structure including an outer panel 52 and an interior wall 54 closer to the cabin than the outer panel 52. There is a cooling chamber 55 between the outer panel 52 and the interior wall 54. The temperature inside the cooling chamber 55 is low because of cold energy transferred from the outer panel 52 which during flight is exposed to outside air having a considerably lower temperature than that near the ground. Alternatively, the outer panel 52 may include an air inlet and air outlet communicating with the cooling chamber 55, and outside air may be introduced into the cooling chamber 55 during flight.

In the aircraft 50, the condenser 3 is located in the cooling chamber 55, while the heat generator 99 and the evaporator 2 thermally connected to the heat generator 99 are located closer to the cabin than the interior wall 54. In the cooling chamber 55, there is a fan 56 forcing a gas stream to pass the condenser 3. The condenser 3 condenses the working fluid using cold energy of outside air. Examples of the heat generator 99 include, but are not limited to: an electronic device including heat-generating parts, such as a control board, an engine control unit (ECU), or a computer; a friction heat-generating mechanical part such as a bearing; and a battery. Instead of the heat generator 99, air inside the cabin may be a heat source.

Configuration of Evaporator 2

Figure 2:
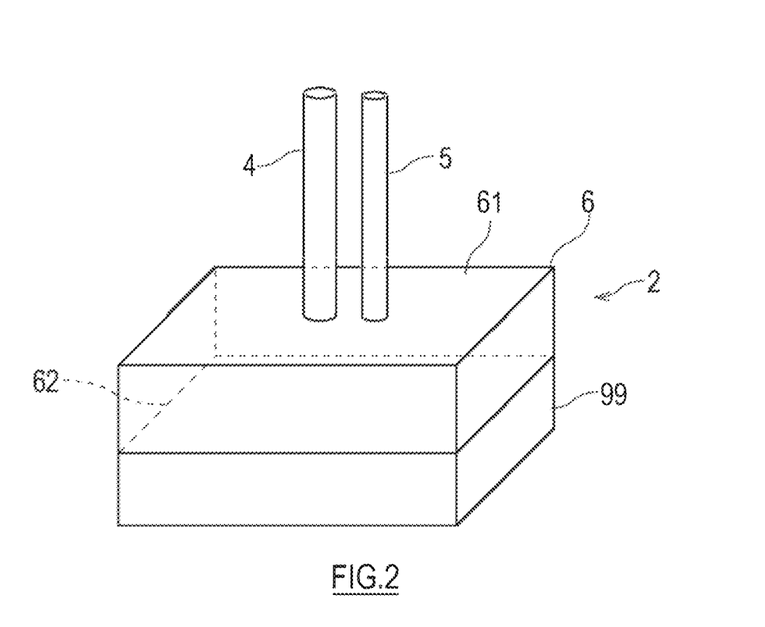
FIG. 2 is a perspective view of an evaporator.
Figure 3:
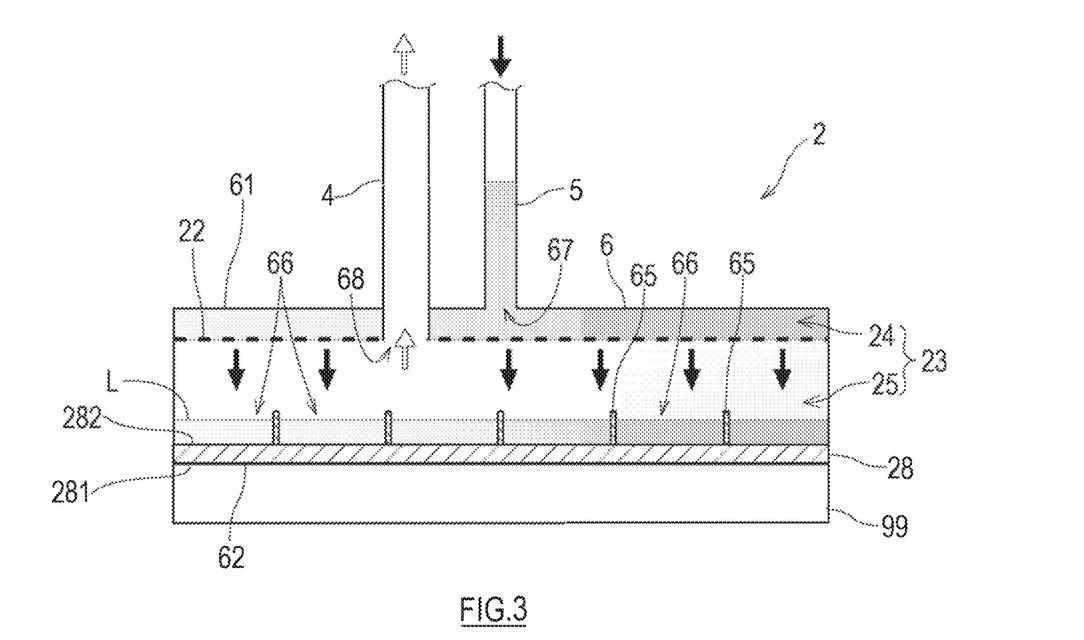
FIG. 3 is a side view for illustrating the internal structure of the evaporator.
Figure 4:
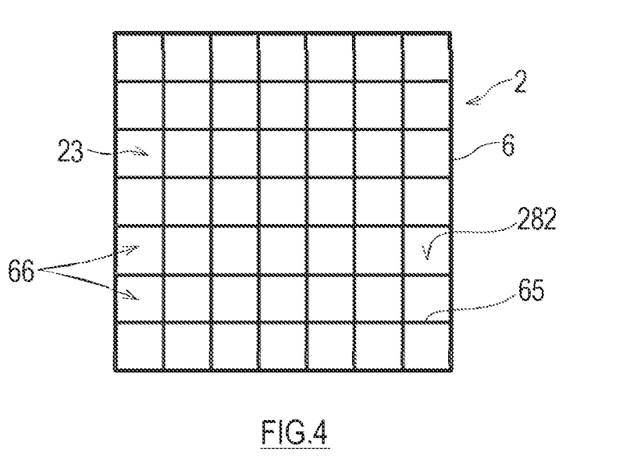
FIG. 4 is a plan view showing the interior of the evaporator to illustrate liquid retainers.
Figure 5:
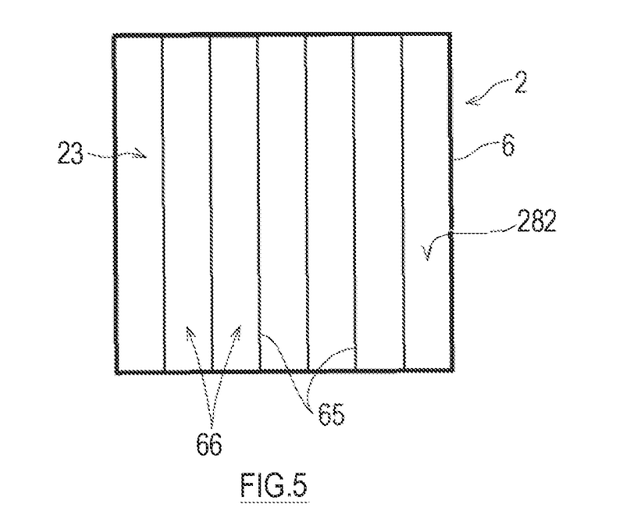
FIG. 5 is a plan view showing the interior of the evaporator to illustrate a variant of the liquid retainers.

The following will describe the configuration of the evaporator 2 of the loop heat pipe 10 configured as described above. FIG. 2 is a perspective view of the evaporator according to this exemplary embodiment. FIG. 3 is a side view for illustrating the internal structure of the evaporator 2. FIG. 4 is a plan view showing the interior of the evaporator 2 to illustrate liquid retainers 66. FIG. 5 is a plan view showing the interior of the evaporator 2 to illustrate a variant of the liquid retainers 66.

As shown in FIGS. 2 and 3, the evaporator 2 according to this exemplary embodiment includes a housing 6 and a heat receiver 28 located on a bottom surface 62 of the housing 6.

The housing 6 is in the shape of a rectangular parallelepiped in which the top and bottom surfaces 61 and 62 have the largest area. The housing 6 includes an accommodation chamber 23 that accommodates the working fluid. A part or all of the bottom surface 62 of the housing 6 is formed by the heat receiver 28. The heat receiver 28 is a plate made of a metal material with high thermal conductivity such as copper. The heat receiver 28 includes a heat-receiving surface 281 on the exterior of the housing 6 and a boiling surface 282 facing the accommodation chamber 23 inside the housing 6. The heat-receiving surface 281 is thermally connected to the heat generator 99 located below the evaporator 2 and receives heat from the heat generator 99.

The accommodation chamber 23 is divided by a porous plate 22 into an upper chamber 24 above the porous plate 22 and a lower chamber 25 below the porous plate 22. The porous plate 22 is parallel to the top and bottom surfaces 61 and 62 of the housing 6. The porous plate 22 includes a large number of pores and permits the working fluid to pass through the pores.

At least one working fluid inlet 67 opens into the upper chamber 24. The working fluid inlet 67 desirably opens at the highest level in the upper chamber 24. The working fluid inlet 67 according to this exemplary embodiment opens at the top surface 61 of the housing 6. The working fluid inlet 67 is connected to the liquid conduit 5 extending upward.

At least one working fluid outlet 68 opens into the lower chamber 25. The working fluid outlet 68 desirably opens at the highest level in the lower chamber 25. The working fluid outlet 68 according to this exemplary embodiment opens at the porous plate 22 forming the ceiling of the lower chamber 25. Alternatively, the working fluid outlet 68 may be located, for example, on a side wall of the housing 6 or at a tip of a conduit inserted into the lower chamber 25 through the housing 6. The working fluid outlet 68 is connected to the vapor conduit 4 extending upward.

The bottom of the lower chamber 25 is divided into liquid retainers 66 by a partition 65. Each liquid retainer 66 accommodates the liquid-phase working fluid. The partition 65 is made of, for example, a metal material with high thermal conductivity such as copper. The material of the partition 65 is not limited to metal materials. The partition 65 according to this exemplary embodiment is a plate-like structure extending vertically from the boiling surface 282 of the heat receiver 28 which is the floor of the accommodation chamber 23 (in particular, the lower chamber 25).

The liquid retainers 66 are recesses arranged in directions in which the transportation machine is tilted ("tilt directions"). In this exemplary embodiment, as shown in FIG. 4, a grid-shaped partition 65 extending vertically from the bottom surface of the lower chamber 25 defines square liquid retainers 66 at the bottom of the lower chamber 25. The liquid retainers 66 are not limited to this form. For example, as shown in FIG. 5, partitions 65 parallel to one another and extending vertically from the floor of the lower chamber 25 may define the rectangular liquid retainers 66 at the bottom of the lower chamber 25.

The partition 65 is not limited to the above forms and may be in any form as long as the partition 65 defines the liquid retainers 66 at the bottom of the lower chamber 25. For example, the partition 65 may be a plate extending vertically from the boiling surface 282 of the heat receiver 28. For example, the partition 65 may be a result of forming the liquid retainers 66 by machining a heat-transfer block in contact with the boiling surface 282.

In the evaporator 2 configured as described above, the liquid-phase working fluid flows into the upper chamber 24 through the liquid conduit 5 and the working fluid inlet 67. The working fluid enters the lower chamber 25 from the upper chamber 24 through the pores of the porous plate 22 and falls into the liquid retainers 66 of the lower chamber 25.

Due to flow resistance accompanying passage through the pores, the working fluid stays temporarily in the upper chamber 24 and spreads horizontally on the porous plate 22, rather than immediately flowing down into the lower chamber 25. Consequently, the liquid-phase working fluid staying in the upper chamber 24 forms a liquid layer with a vertical thickness in the upper chamber 24. Thus, the working fluid in the upper chamber 24 is delivered not only to pores directly below the working fluid inlet 67 but also to pores horizontally away from the working fluid inlet 67.

In the manner as described above, the working fluid falls through the large number of pores distributed evenly over the entire porous plate 22. Thus, the working fluid is delivered not only to the liquid retainers 66 directly below the working fluid inlet 67 but also to the liquid retainers 66 horizontally away from the working fluid inlet 67. The liquid surface L of the liquid-phase working fluid accommodated in the liquid retainers 66 is at a lower level than the top of the partition 65 when the boiling surface 282 is in a horizontal position. The liquid surface may be at the same or a higher level than the top of the partition 65.

The heat that the heat receiver 28 receives from the heat generator 99 is released to the working fluid through the boiling surface 282 and the partition 65. The heat causes at least part of the liquid-phase working fluid in the liquid retainers 66 to boil into a gas phase. Consequently, the region above the liquid surface L in the lower chamber 25 is filled with the gas-phase working fluid (or the two-phase working fluid including the gas and liquid phases). Strictly speaking, there is no liquid surface L in the two-phase fluid. However, given that in the working fluid located in the lower chamber 25, the volume proportion of the gas present in the liquid increases upward, a boundary plane at which the volume percentage of the gas (void percentage) in the gas-liquid two-phase flow is a given value (e.g., 50%) can be defined as an imaginary liquid surface

[Structure of Porous Plate 22]

The porous plate 22 includes a large number of pores distributed regularly and evenly over the entire porous plate 22. The pores are not limited to being circular, and the porous plate 22 may be, for example, a perforated metal or a metal net. The total area of the porous plate 22 depends on the size of the housing 6 of the evaporator 2. Thus, selectable parameters of the porous plate 22 are the number of pores, the pore size, and the plate thickness. The pore size may be an average size of the pores.

For the porous plate 22, the pressure applied at the pores from the direction of the upper chamber 24 is referred to as "first pressure P1", and the pressure applied at the pores from the direction of the lower chamber 25 is referred to as "second pressure P2". The first pressure P1 corresponds to a difference calculated by subtracting the following pressure drops from the hydraulic head pressure applied to the porous plate 22 by the working fluid present in the upper chamber 24 and liquid conduit 5: a pressure drop accompanying passage of the working fluid through the liquid conduit 5; a pressure drop accompanying an abrupt expansion of flow path upon entry of the working fluid from the liquid conduit 5 into the upper chamber 24; and a pressure drop caused by the surface tension of the working fluid. The first pressure P1 may be considered approximately equal to the hydraulic head pressure. The second pressure P2 is a pressure applied to the porous plate 22 by the working fluid present in the lower chamber 25, and varies according to the amount of evaporation of the working fluid in the lower chamber 25.

For the working fluid to pass from the upper chamber 24 to the lower chamber 25, the first pressure P1 must be greater than the sum of the second pressure P2 and the pressure drop Δp of the working fluid passing through the porous plate 22 (P1>P2+Δp). Thus, the open area ratio ε of the porous plate 22 may be set so that the first pressure P1 during rated operation is greater than the sum of the second pressure P2 and the pressure drop Δp during rated operation. However, if the first pressure P1 is significantly greater than the sum of the second pressure P2 and the pressure drop Δp of the working fluid passing through the porous plate 22, the working fluid entering the upper chamber 24 flows out into the lower chamber 25 without staying in the upper chamber 24. The pressure drop Δp of the working fluid passing through the porous plate 22 can be determined by a known equation shown below in Mathematical Formula 1, and the pressure drop for ensuring the working pressure in a desired operation state can be appropriately set.

Mathematical Formula 1

$$\Delta P = \zeta \cdot \left( \frac{\rho \cdot u_o^2}{2} \right) \quad (1)$$

$$\zeta = \left[ 0.5 + (1-\varepsilon)^2 + \tau(1-\varepsilon) + \lambda \frac{l}{d_h} \right] \times \frac{1}{\varepsilon^2} \quad (2)$$

$$\lambda = \frac{0.3164}{Re^{0.25}} \quad (3)$$

$$Re = \frac{d_h u_o \rho}{\mu} \quad (4)$$

Symbols List $d_h$: Equivalent diameter [m]=4/wetted perimeter [m] x cross-sectional area of flow [m²]
Re: Reynolds number [−]
l: Thickness of porous plate [m]
ΔP: Pressure drop across porous plate [Pa]
$u_0$: Average flow velocity of fluid passing through pores [m/s]
ε: Open area ratio of porous plate [−]=pore area [m²]/ porous plate area [m²]
ζ: Coefficient of drag [−]
λ: Coefficient of friction drag [−]
μ: Viscosity of fluid [Pa·s]
ρ: Density of fluid [kg/m³]
τ: Function with respect to ratio between thickness of porous plate and pore size [−]

The parameters defining the pressure drop Δp of the working fluid passing through the pores of the porous plate 22 are the density ρ of the working fluid, the average flow velocity $u_0$ of the working fluid, and the coefficient of drag ζ. The parameters defining the coefficient of drag ζ are the open area ratio ε of the porous plate 22, the coefficient of friction drag λ, the equivalent diameter $d_h$ of the pores, and the function τ with respect to the ratio between the thickness (1) of the porous plate 22 and the pore size. The open area ratio ε of the porous plate 22 is chosen based on the pressure drop Δp. The open area ratio ε of the porous plate 22 is defined as the ratio of the sum of the areas of the pores to the total area of the porous plate 22. The thickness of the porous plate 22 is chosen in view of a plate strength suitable for the open area ratio ε. The thickness 1 of the porous plate 22 is desirably small, but the porous plate 22 could lack sufficient strength if the thickness 1 is less than 0.01 mm.

The pressure drop Δp across the porous plate 22 is sensitive to variations in the open area ratio ε and equivalent diameter $d_h$ of the porous plate 22. One of the parameters defining the equivalent diameter $d_h$ is the cross-sectional area of flow through the pores, and the equivalent diameter $d_h$ is a function of the pore size. The combination of the pore size and the number of the pores can be chosen based on the open area ratio ε. Desirably, the pore size is 0.01 mm or more. Depending on the type of the working fluid, a pore size of less than 0.01 mm could cause an excessive pump head leading to interrupted flow of the working fluid.

In the evaporator 2, the use of the porous plate 22 with a suitable open area ratio ε allows the working fluid to penetrate through the porous plate 22 evenly from the upper chamber 24 into the lower chamber 25.

Figure 6:
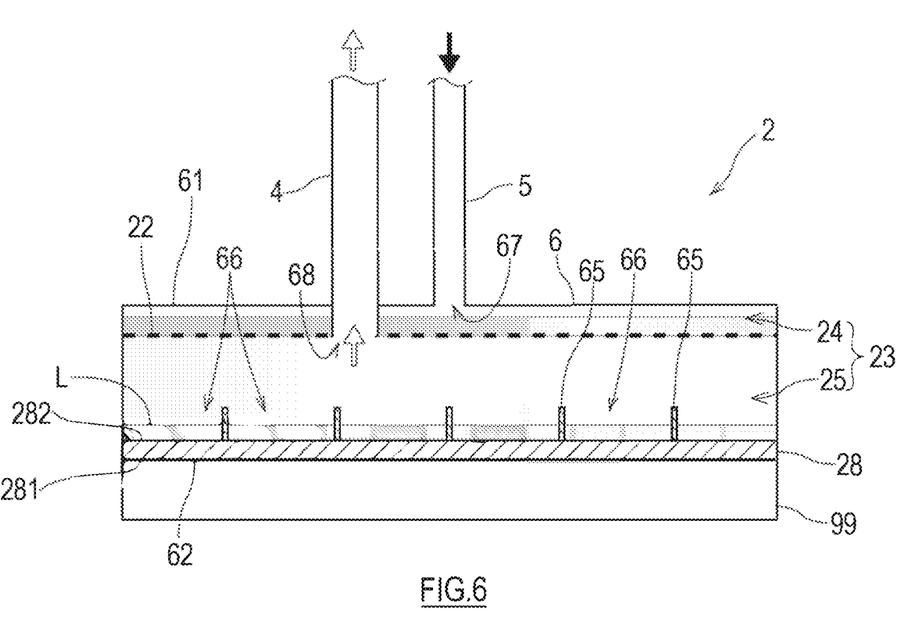
FIG. 6 is a side view of the evaporator in a state where the amount of the liquid-phase working fluid flowing into the evaporator is small.

For example, the pressure drop Δp across the porous plate 22 can be set so as to prevent passage of the working fluid through the porous plate 22 until the liquid layer 71 in the upper chamber 24 reaches a given thickness. In this case, as shown in FIG. 6, the working fluid spreads evenly on the porous plate 22 since passage of the working fluid through the porous plate 22 is prevented until the working fluid in the upper chamber 24 forms a layer with a given thickness. As a result, the working fluid can penetrate through the porous plate 22 evenly from the upper chamber 24 into the lower chamber 25.

For example, the pressure drop Δp across the porous plate 22 can be set so as to prevent the working fluid from flowing back from the lower chamber 25 into the upper chamber 24. In this case, the liquid-phase working fluid penetrates through the porous plate 22 into the lower chamber 25 when the flow rate of the working fluid flowing into the evaporator 2 or the amount of evaporation of the working fluid in the evaporator 2 is in a given rated range. In case that the pressure of the working fluid in the lower chamber 25 sharply increases due to an abrupt increase in the amount of evaporation of the working fluid, the pressure variation (pulsation) is mitigated by the porous plate 22 and the working fluid in the upper chamber 24.

As described above, an evaporator 2 according to this exemplary embodiment is an evaporator that receives heat from a heat generator 99 to change at least part of a working fluid from a liquid phase to a gas phase, the evaporator 2 including: a housing 6 including an accommodation chamber 23 that accommodates the working fluid; and a heat receiver 28 located on a bottom surface 62 of the housing 6 and thermally connected to the heat generator 99. The housing 6 includes: a porous plate 22 dividing the accommodation chamber 23 into an upper chamber 24 and a lower chamber 25 and including a large number of pores through which the upper and lower chambers 24 and 25 communicate with each other; at least one working fluid inlet 67 opening into the upper chamber 24; a partition 65 dividing a bottom of the lower chamber 25 into liquid retainers 66; and at least one working fluid outlet 68 opening into the lower chamber 25 and located above the partition 65.

A loop heat pipe 10 according to this exemplary embodiment includes: the above evaporator 2 that changes part of a working fluid from a liquid phase to a gas phase; a condenser 3 that changes the working fluid from the gas phase to the liquid phase; a vapor conduit 4 connecting the working fluid outlet 68 of the evaporator 2 and an inlet of the condenser 3; and a liquid conduit 5 connecting an outlet of the condenser 3 and the working fluid inlet 67 of the evaporator 2.

In the evaporator 2 and loop heat pipe 10 configured as described above, the liquid-phase working fluid flowing into the upper chamber 24 of the accommodation chamber 23 of the evaporator 2 enters the lower chamber 25 through the pores of the porous plate 22 and falls into the liquid retainers 66 of the lower chamber 25. Due to flow resistance accompanying passage through the pores, the working fluid in the upper chamber 24 spreads on the porous plate 22 rather than immediately flowing down into the lower chamber 25. Thus, the working fluid in the upper chamber 24 is delivered not only to pores directly below the working fluid inlet 67 but also to pores horizontally away from the working fluid inlet 67, and then falls into the lower chamber 25. As such, the working fluid is delivered not only to the liquid retainers 66 directly below the working fluid inlet 67 but also to the liquid retainers 66 horizontally away from the working fluid inlet 67.

In the evaporator 2 and loop heat pipe 10 configured as described above, in case that the bottom surface 62 of the housing 6 of the evaporator 2 is tilted from the horizontal, the liquid-phase working fluid in the liquid retainers 66 is blocked by the partition 65 from flowing downward along the tilted bottom surface 62 and remains in the liquid retainers 66. Thus, in case that the position of the evaporator 2 is changed and the bottom surface 62 of the housing 6 is tilted from the horizontal, the working fluid remains at the bottom of the accommodation chamber 23, and the heat receiver 28 and the working fluid can be kept in thermal contact. Even in case that the heat receiver 28 has dry portions that are not in thermal contact with the working fluid, the dry portions are distributed over different zones of the heat generator 99 with which the heat receiver 28 is in thermal contact, rather than being localized over a particular zone of the heat generator 99, Thus, despite the change in the position of the evaporator 2, the entire region of the heat generator 99 that is in contact with the heat receiver 28 can be cooled efficiently.

In the evaporator 2 and loop heat pipe 10 according to this exemplary embodiment, the upper chamber 24 includes a liquid layer 71 having a given thickness and including the liquid-phase working fluid staying temporarily in the upper chamber 24 after flowing into the upper chamber 24 through the working fluid inlet 67. To this end, in the evaporator 2 and loop heat pipe 10 according to this exemplary embodiment, the porous plate 22 has an open area ratio ε that allows the working fluid to stay temporarily in the upper chamber 24 so that the upper chamber 24 includes a liquid layer 71 having a given thickness and including the liquid-phase working fluid.

Thus, the hydraulic head pressure of the liquid-phase working fluid flowing into the upper chamber 24 of the evaporator 2 can prevent back flow of the working fluid from the lower chamber 25 into the upper chamber 24. Additionally, the working fluid can penetrate from the upper chamber 24 into the lower chamber 25 through the large number of pores distributed over the entire porous plate 22.

Although the foregoing has described a preferred embodiment of the present disclosure, the scope of the present disclosure embraces modifications made to the details of the structures and/or functions of the above embodiment without departing from the concept of the present disclosure.

The invention claimed is:

1. An evaporator that receives heat from a heat generator to change at least part of a working fluid from a liquid phase to a gas phase, the evaporator comprising:
 a housing including an accommodation chamber that accommodates the working fluid; and
 a heat receiver located on a bottom surface of the housing and thermally connected to the heat generator, wherein the housing includes
  a porous plate dividing the accommodation chamber into an upper chamber and a lower chamber and including pores through which the upper and lower chambers communicate with each other,
  at least one working fluid inlet opening into the upper chamber,
  a partition dividing a bottom of the lower chamber into liquid retainers, adjacent liquid retainers being completely separated from each other by portions of the partition in plan view, and
  at least one working fluid outlet opening into the lower chamber and located above the partition.

2. The evaporator according to claim 1, wherein the porous plate is configured to stay the liquid-phase working fluid on the porous plate such that the upper chamber includes a liquid layer of the liquid-phase working fluid.

3. A loop heat pipe comprising:
 the evaporator according to claim 1 that changes at least part of a working fluid from a liquid phase to a gas phase;
 a condenser that changes the working fluid from the gas phase to the liquid phase;
 a vapor conduit connecting the working fluid outlet of the evaporator and an inlet of the condenser; and
 a liquid conduit connecting an outlet of the condenser and the working fluid inlet of the evaporator.

4. A loop heat pipe comprising:
 the evaporator according to claim 2 that changes at least part of the working fluid from the liquid phase to a gas phase;
 a condenser that changes the working fluid from the gas phase to the liquid phase;
 a vapor conduit connecting the working fluid outlet of the evaporator and the inlet of the condenser; and
 a liquid conduit connecting the outlet of the condenser and the working fluid inlet of the evaporator.

5. The evaporator according to claim 1, wherein the porous plate is configured to allow the working fluid to penetrate therethrough evenly from the upper chamber into the lower chamber.

6. The evaporator according to claim 1, wherein the porous plate is configured to allow the working fluid to spread evenly on the porous plate.

7. The evaporator according to claim 1, wherein pores are distributed evenly over the entire porous plate.

8. An evaporator that receives heat generated by an electronic device to change at least part of a working fluid from a liquid phase to a gas phase, the evaporator comprising:
 a housing including an accommodation chamber that accommodates the working fluid; and
 a heat receiver located on a bottom surface of the housing and thermally connected to the electronic device, wherein
 the housing includes
  a porous plate dividing the accommodation chamber into an upper chamber and a lower chamber and including pores through which the upper and lower chambers communicate with each other,
  at least one working fluid inlet opening into the upper chamber,
  a partition dividing a bottom of the lower chamber into liquid retainers, adjacent liquid retainers being completely separated from each other by portions of the partition in plan view, and
  at least one working fluid outlet opening into the lower chamber and located above the partition.

9. An evaporator that receives heat from a heat generator to change at least part of a working fluid from a liquid phase to a gas phase, the evaporator comprising:
- a housing including an accommodation chamber that accommodates the working fluid; and
- a heat receiver located on a bottom surface of the housing and thermally connected to the heat generator, wherein the housing includes
    - a porous plate dividing the accommodation chamber into an upper chamber and a lower chamber and including pores through which the upper and lower chambers communicate with each other,
    - at least one working fluid inlet opening into the upper chamber,
    - a partition dividing a bottom of the lower chamber into liquid retainers, and
    - at least one working fluid outlet opening into the lower chamber and located above the partition, the at least one working fluid outlet extending from a top surface of the lower chamber through the upper chamber and penetrating a top surface of the housing.

\* \* \* \* \*